United States Patent
Roath et al.

(10) Patent No.: US 8,525,034 B2
(45) Date of Patent: Sep. 3, 2013

(54) CABLE GUIDE AND METHOD OF CABLE TERMINATION

(75) Inventors: Alan L. Roath, Madison, OH (US); Corinne W. Baumann, Mentor, OH (US)

(73) Assignee: Ohio Associated Enterprises, LLC, Painesville, OH (US)

( * ) Notice: Subject to any disclaimer, the term of this patent is extended or adjusted under 35 U.S.C. 154(b) by 373 days.

(21) Appl. No.: 13/036,064

(22) Filed: Feb. 28, 2011

(65) Prior Publication Data

US 2011/0209900 A1 Sep. 1, 2011

Related U.S. Application Data

(60) Provisional application No. 61/309,025, filed on Mar. 1, 2011.

(51) Int. Cl.
| | |
|---|---|
| H01B 7/00 | (2006.01) |
| H02G 3/04 | (2006.01) |
| H02G 3/00 | (2006.01) |
| H05K 1/00 | (2006.01) |
| H01R 43/00 | (2006.01) |

(52) U.S. Cl.
USPC ......... 174/135; 174/68.1; 174/70 R; 174/250; 29/868

(58) Field of Classification Search
USPC .................. 174/68.1, 70 R, 135, 138 G, 139, 174/154, 158 R, 250; 29/868; 439/393
See application file for complete search history.

(56) References Cited

U.S. PATENT DOCUMENTS

| | | | |
|---|---|---|---|
| 5,676,339 A * | 10/1997 | Simon | 248/56 |
| 7,299,549 B2 * | 11/2007 | Montena | 29/857 |
| 7,847,188 B2 * | 12/2010 | Liu et al. | 174/36 |
| 2004/0242045 A1 * | 12/2004 | Griffin | 439/259 |
| 2006/0105613 A1 * | 5/2006 | Carroll | 439/404 |
| 2009/0032282 A1 * | 2/2009 | Sedor et al. | 174/135 |

* cited by examiner

*Primary Examiner* — Timothy Thompson
*Assistant Examiner* — Sherman Ng
(74) *Attorney, Agent, or Firm* — Renner, Otto, Boisselle & Sklar, LLP

(57) ABSTRACT

A cable guide is used to constrain and locate wires or cables for preparation for and for connection to a circuit board or connector, for termination. The cable guide has openings that receive and secure wires during the termination process. A shaft of the cable guide may be used to secure, in a repeatable manner, a predetermined length of the wires with ends offset from a cable jacket, or other reference on or near the end of the cable. The cable guide and the cable/wires may be secured in a fixture that allows the wire ends to be repeatably scored to remove insulation.

17 Claims, 8 Drawing Sheets

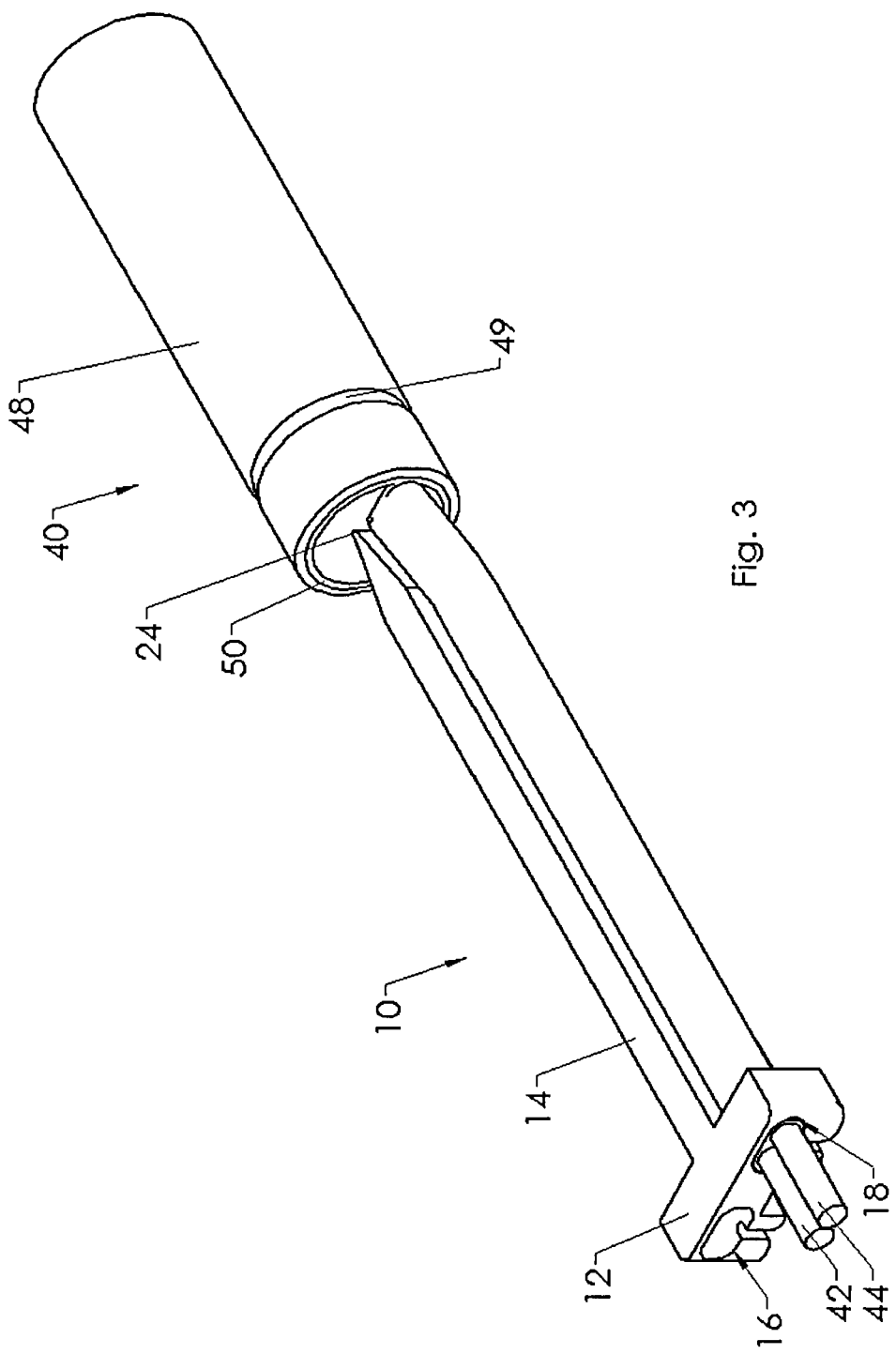

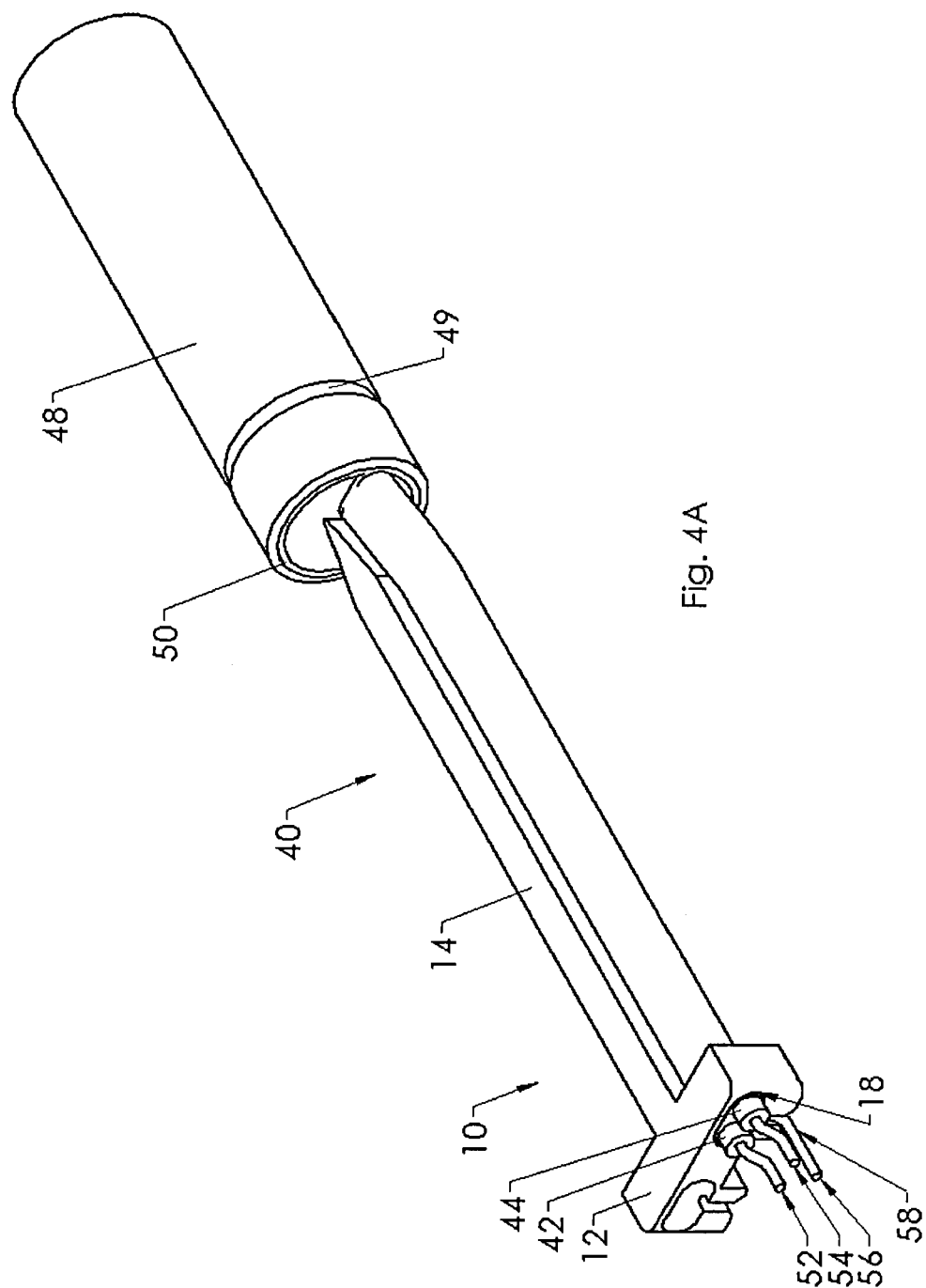

CABLE GUIDE AND METHOD OF CABLE TERMINATION

This application claims the benefit under 35 USC 119 of U.S. Provisional Application 61/309,025, filed Mar. 1, 2011, which is incorporated by reference in its entirety.

BACKGROUND OF THE INVENTION

1. Field of the Invention

The invention is in the field of electrical cables or wires, and terminations of cables or wires.

2. Description of the Related Art

Use of electrical cables or wires requires termination of the cables or wires, such as to connect to a circuit board or connector. Improvements in cable or wire terminations are always desirable.

SUMMARY OF THE INVENTION

According to an aspect of the invention, a cable guide is used in terminating a cable by connecting one or more wires of the cable to a circuit board or connector, for example to form a cable assembly.

According to another aspect of the invention, a cable guide includes: a body having one or more wire-receiving openings therein; and a shaft extending from the body. The cable guide may also have one or more of the following features: one or more slots in the body in communication with respective of the wire-receiving openings; compliant features or resilient members on the body that can engage corresponding openings on a connector or printed circuit board; the shaft has a pointed or narrowed end; the cable guide is a one-piece continuous monolithic part, acting as a gauge that sets the cable termination and strain relief locations, that may be made of molded plastic.

According to yet another aspect of the invention, a method of terminating a cable includes: mechanically coupling one or more wires of a cable to a cable guide. The method may also include one or more of the following: the mechanically coupling the one or more wires to the cable guide allows ends of the one or more wires to be prepped a predetermined consistent distance from a cable jacket of the cable; scoring ends of the one or more wires, wherein the scoring may include laser scoring; placing the cable guide and the one or more wires in a fixture prior to the scoring; mechanically coupling the cable guide to a printed circuit board or connector, wherein the mechanically coupling may include engaging one or more compliant features of the cable guide with corresponding openings of the printed circuit board or connector, such as by snapping in the compliant features; the mechanically coupling the cable guide to the printed circuit board or connector aligns the ends of the one or more wires with contact pads or other conductors of the printed circuit board or connector; electrically connecting the one or more wires to the printed circuit board or connector and controlling the spacing between the two terminated twin-ax signals thereby controlling the impedance at the termination; leaving the cable guide coupled to the printed circuit board or connector after the electrically connecting, such as during other manufacturing steps involving the connector or printed circuit board.

According to a further aspect of the invention, a cable guide acts as a gage for wire prepping to assure uniform physicals of two conductors. The cable guide aids in positioning for termination. The consistency in termination may be very important in termination for high-speed cables. The quality of the signal is dependent on the consistency of the impedance of the termination. Ideally the termination is an invisible termination, one in which the impedance is matched to the cable. Getting closer to this ideal is advantageous. The more consistent the stripping and termination is, the more consistent is the impedance.

According to a still further aspect of the invention, a cable guide acts as a strain relief. The guide captures the wires and ties them to the printed circuit board (PCB) via the compliant section of the cable guide, and the slot in the PCB. The conductors are subject to torsion as a result of normal movement of the cable outside of the connector. If not constrained, this torsional movement will pull off the PCB pads to which the conductors are soldered.

According to another aspect of the invention, a cable guide includes: a body having a wire-receiving opening therein; and a shaft extending from the body. The shaft maintains wires of a cable that may be coupled to the cable guide and located in the wire-receiving opening, a predetermined distance away from a cable jacket of the cable.

According to yet another aspect of the invention, a method of terminating a cable, the method including the steps of: mechanically coupling wires of a cable to a cable guide, wherein the cable guide includes a body having a wire-receiving opening, and a shaft extending from the body, and wherein the mechanically coupling includes securing the wires in the wire-receiving opening, with the shaft maintaining the ends of the wires at least a predetermined distance away from a jacket of the cable; preparing the ends of the wires for connection to a printed circuit board; and mechanically coupling the cable to the printed circuit board.

According to still another aspect of the invention, a cable guide is in combination with a cable. The cable guide includes: a body having first and second wire-receiving openings therein; and a shaft extending from the body. The cable is a twinax cable that includes: a first pair of wires; a second pair of wires; and a cable jacket that surrounds at least portions of the pairs of wires. The cable guide is mechanically coupled to the cable such that the shaft is between the pairs of wires. Ends of the first pair of wires are secured in the first wire-receiving opening. Ends of the second pair of wires are secured in the second wire-receiving opening. The ends of the pairs of wires a predetermined distance away from where the pairs of wires separate from the cable jacket.

According to a further aspect of the invention, a method of terminating a twinax cable having a first pair of wires and a second pair of wires, includes: mechanically coupling the pairs of wires to a cable guide, wherein the cable guide includes a body having a first wire-receiving opening and a second wire-receiving opening, and a shaft extending from the body, and wherein the mechanically coupling includes securing the pairs of wires in respective of the wire-receiving openings, with the shaft maintaining the ends of the wires at least a predetermined distance away from a jacket of the cable, and with the shaft between the first pair of wires and the second pair of wires; preparing the ends of the wires for connection to a printed circuit board; and mechanically coupling the cable to the printed circuit board.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, illustrate aspects of the invention.

FIG. 3 is an oblique view of the cable guide of FIG. 1, coupled to a cable.

FIG. 4A is another oblique view of the cable guide and cable of FIG. 3, with insulation removed from wire ends.

DETAILED DESCRIPTION

A cable guide is used to constrain and locate wires or cables for preparation for and for connection to a circuit board or connector, for termination. The cable guide has openings that receive and secure wires during the termination process. A shaft of the cable guide may be used to secure, in a repeatable manner, a predetermined length of the wires with ends offset from a cable jacket, or other reference on or near the end of the cable. The cable guide and the cable/wires may be secured in a fixture that allows the wire ends to be repeatably scored to remove insulation.

The cable guide may also be used to provide support as the wires are secured to circuit board or connector. The cable guide may have compliant protrusions that snap into the circuit board or connector, to hold the wires in place as the wire ends are secured, such as by soldering. The cable guide may stay in place throughout the manufacturing process (and after the manufacturing process). This protects the termination and its connection, for instance from torsion loads during manufacturing that could cause peeling of contact pads on a printed circuit board.

In the following description the term "wire" is generally used to refer to a single metal electrical conductor, with or without an insulation covering. The term "cable" is used in general to refer to combinations of multiple wires in an insulation sheath. An example of a cable is twinax cable, in which one or more pairs of individually insulation-coated conductors (wires) are surrounded by a braided or other conductive shield that may be in contact with a ground wire. Although the above usage is generally followed with regard to the particular embodiment described herein, it should be understood that the invention should not be limited to the usages of these words. Rather the invention applies broadly to termination of electrical conductors, be they termed "wires" or "cables."

Figure 1:
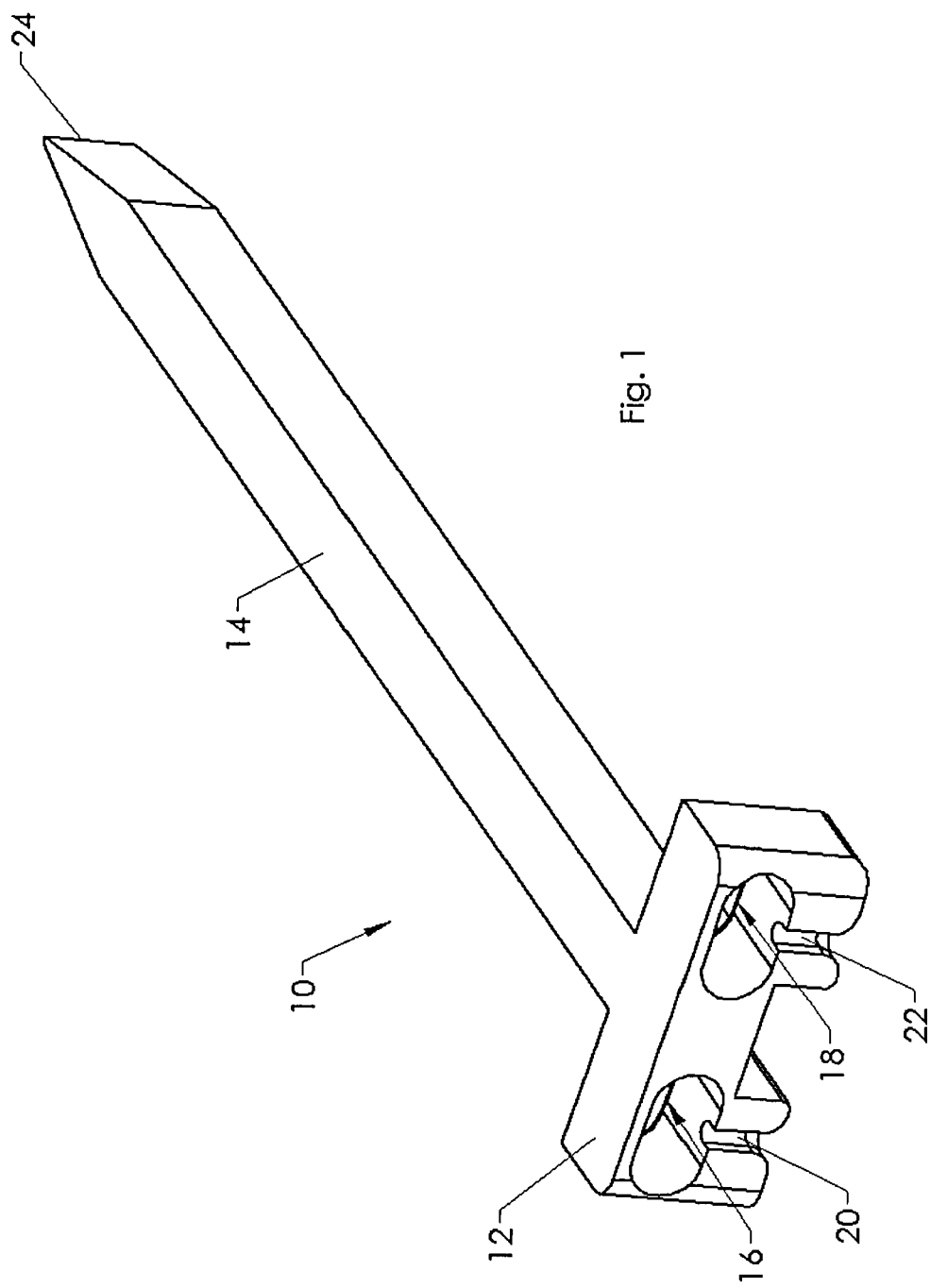
FIG. 1 is an oblique view of a cable guide in accordance with an embodiment of the present invention.
Figure 2:
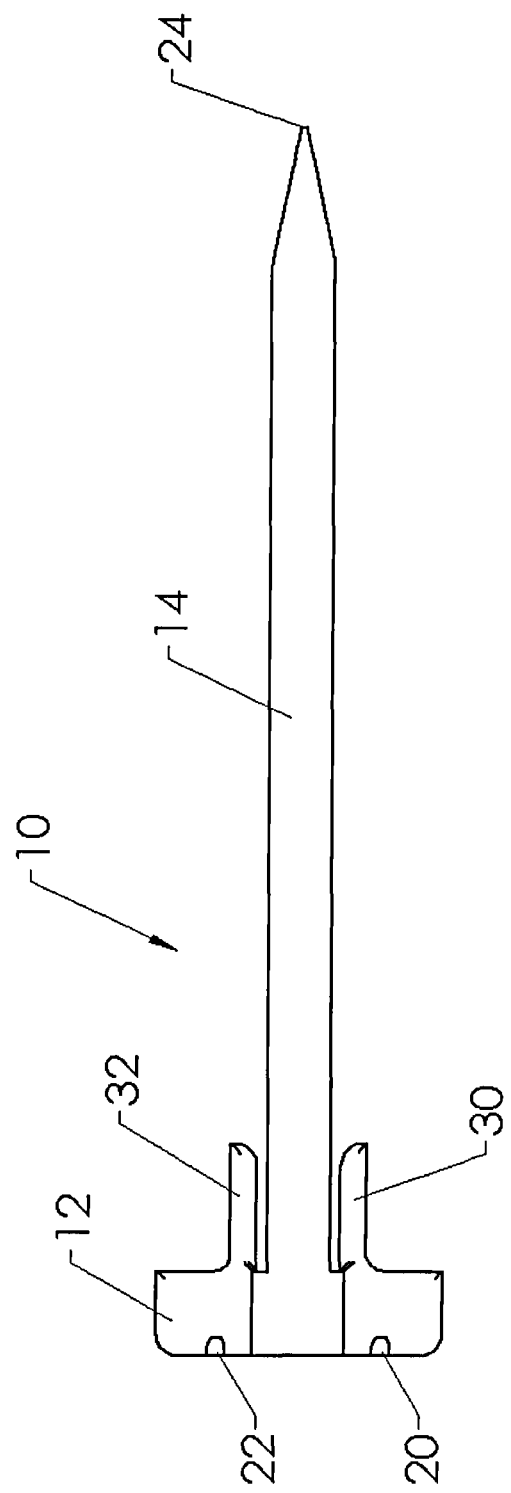
FIG. 2 is a plan view of the cable guide of FIG. 1.

FIGS. 1 and 2 shows a cable guide 10 that may be used to aid in manufacture of a cable termination, the connection of wires of a cable to a connector or printed circuit board (PCB). The cable guide 10 may be a continuous monolithic single piece object. It may be made out of a suitable molded plastic, although it will be appreciated that other suitable materials may be used. The cable guide 10 includes a body 12, and a shaft 14 extending from the body 12. The body 12 has a pair of wire-receiving openings 16 and 18 on opposite sides of the shaft 14. The wire-receiving openings 16 and 18 are used for receiving, holding, and locating wires of a cable, so as to facilitate termination of the cable to a connector or PCB. The body 12 also has a pair of slots 20 and 22 that extend downward from and are in communication with the openings 16 and 18. The slots 20 and 22 may be used for securing ground wires that pass through the openings 16 and 18, as described further below.

The shaft 14 has a pointed end 24 for making contact with a minimal area of a cable. The shaft 14 is used to offset a predetermined length of ends of wires of a cable from other parts of the cable, such as parts of a twinax cable still covered by an outer insulation sheath.

The cable guide 10 includes compliant members 30 and 32 on an underside of the cable guide 10. The compliant members 30 and 32 may be compliant tabs that run parallel to the shaft 14. As discussed below in greater detail, the compliant members 30 and 32 may be used to snap into corresponding recesses in a board (or connector), to secure the cable guide 10 in a predetermined position relative to the board. This may position wire ends of the cable in an advantageous protection for connection to the board (or connector).

FIG. 3 shows the cable guide 10 coupled to a cable 40, with signal wires 42 and 44, which may include conductors, insulation, and shielding, inserted into the wire-receiving opening 18. The pointed end 24 of the shaft 14 is in contact with the jacket portion of the cable 40. The cable jacket 48 may be material of the cable 40 that keeps the various wires of the cable together, and provides additional insulation. The signal wires 42 and 44 are thus held in place a predetermined distance away from the cable jacket 48. The cable jacket 48 may have a groove or depression 49, indicating the point of compression engagement caused by a backshell (not shown), in order to provide strain relief. A ferrule 50 may be secured under the cable jacket 48, flush with the end of the cable jacket 48.

Figure 4B:
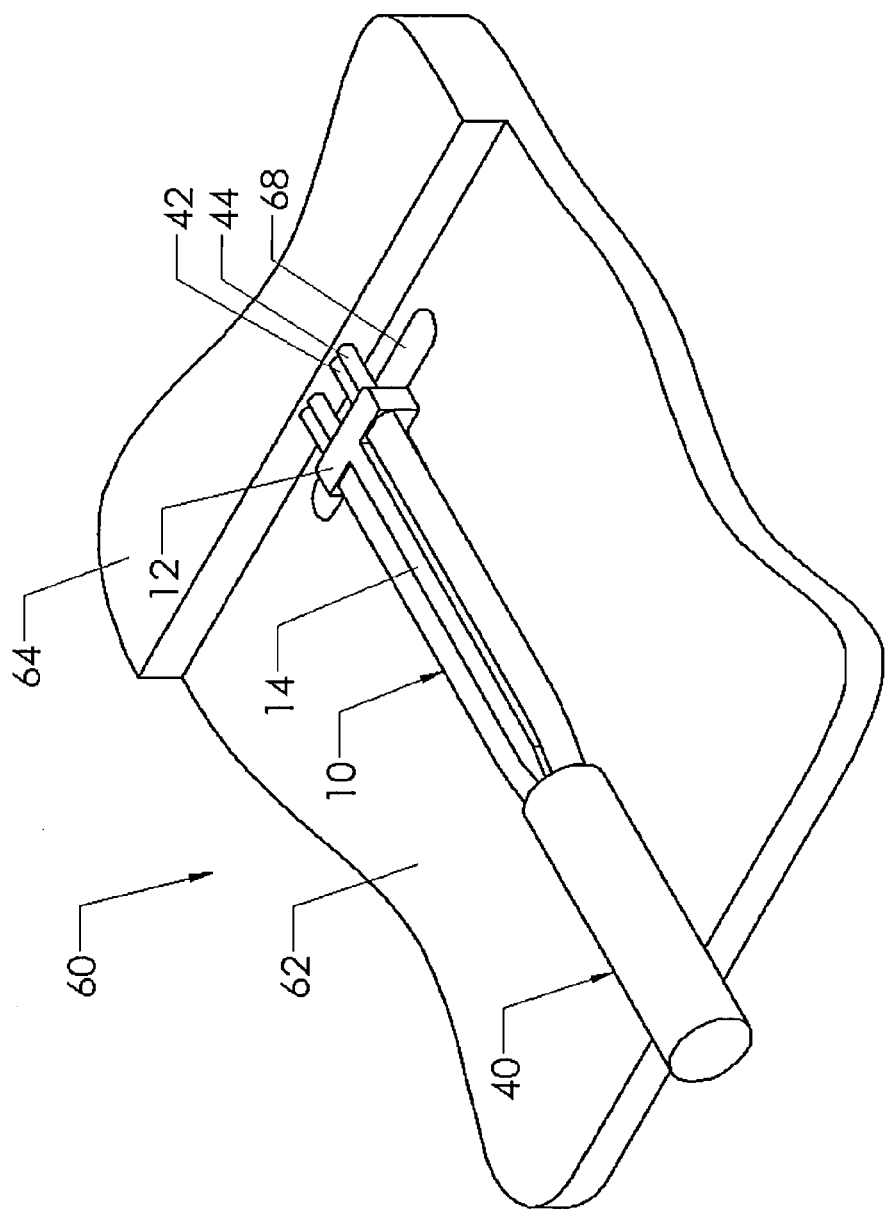
FIG. 4B is an oblique view of the cable guide and cable of FIG. 3, coupled to a fixture.

Holding the wires 42 and 44 with the cable guide 10 secures the signal wires 42 and 44 to facilitate removal of insulation and shielding from ends of the signal wires 42 and 44, as illustrated in FIG. 4A. The removal of insulation and shielding uncovers signal wire ends 52 and 54, and may also uncover an end 56 of a ground conductor or wire 58. The ground conductor or wire 58 may be a return path for the signal wires 42 and 44, or may otherwise be part of the cable 40. The ground conductor end 56 may be placed in the slot 22 that extends downward from the opening 18. The cable guide 10 may facilitate use of laser scoring or other processes to remove insulation repeatably at predetermined locations along the wires 42 and 44. The cable guide 10 and the end of the cable 40 may be placed in a fixture 60, shown in FIG. 4B, that is positioned at a set location relative to a laser or other device used for scoring or otherwise removing insulation from ends of the signal wires 42 and 44. The fixture 60 may have a platform 62 that the cable 40 and the cable guide 10 rest on, with the cable end up against a cable stop 64. The fixture 60 may hold the cable guide 10 and the end of the cable 40 such that scoring occurs at or close to the edge of the cable guide body 12 that is on the opposite side of the body 12 from the shaft 14. The scoring may occur by a laser passing through a laser window 68 in the platform 62, at a predetermined distance (or range of distances) from the cable stop 64. The compliant members 30 and 32 (FIG. 2) may be used to hold the cable guide 10 in place relative to the fixture. Alternatively, the fixture may engage other parts or features of the cable guide 10.

Figure 5:
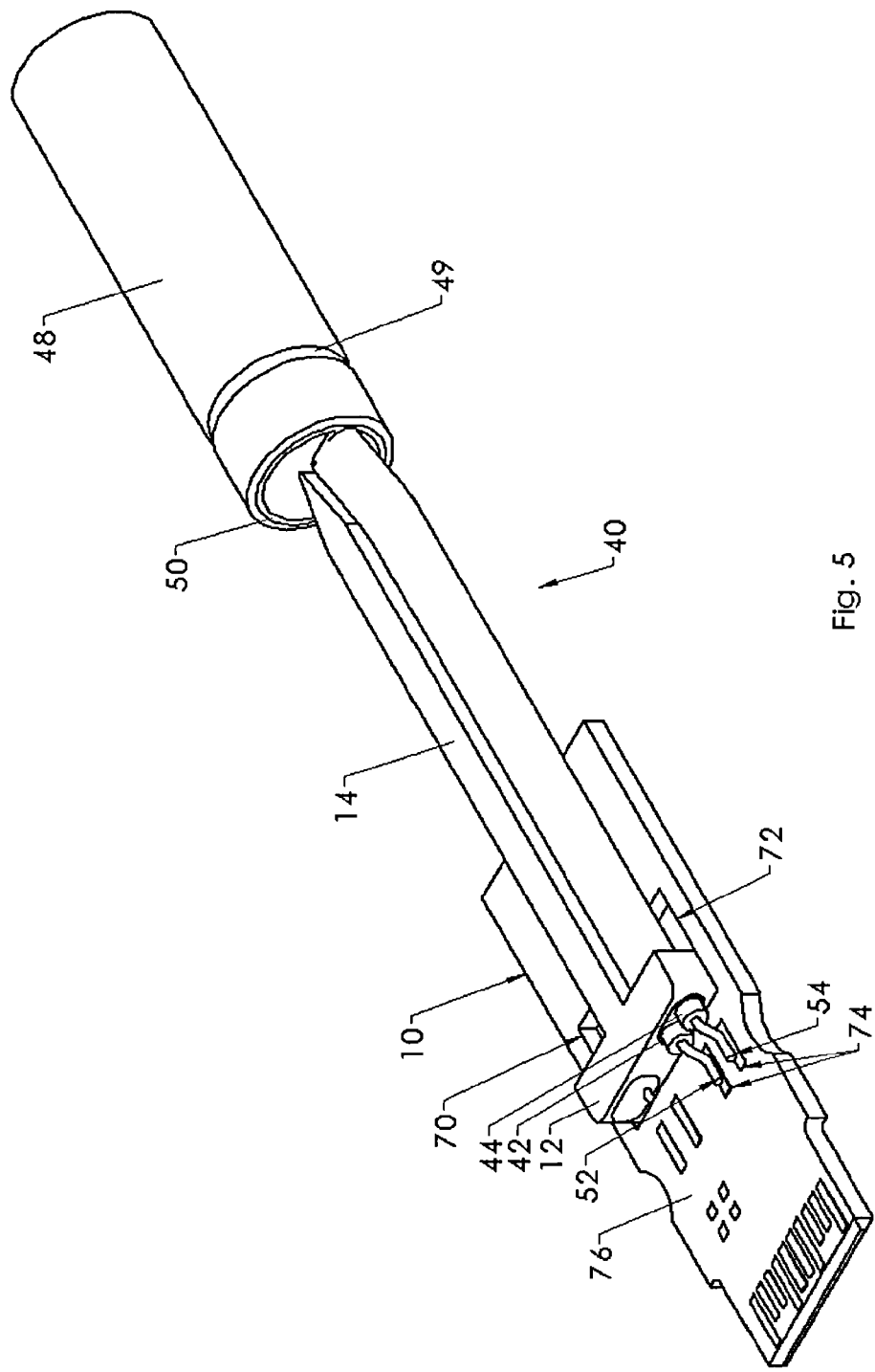
FIG. 5 is an oblique view of the cable guide and cable of FIG. 3, in combination with a printed circuit board (PCB).
Figure 6:
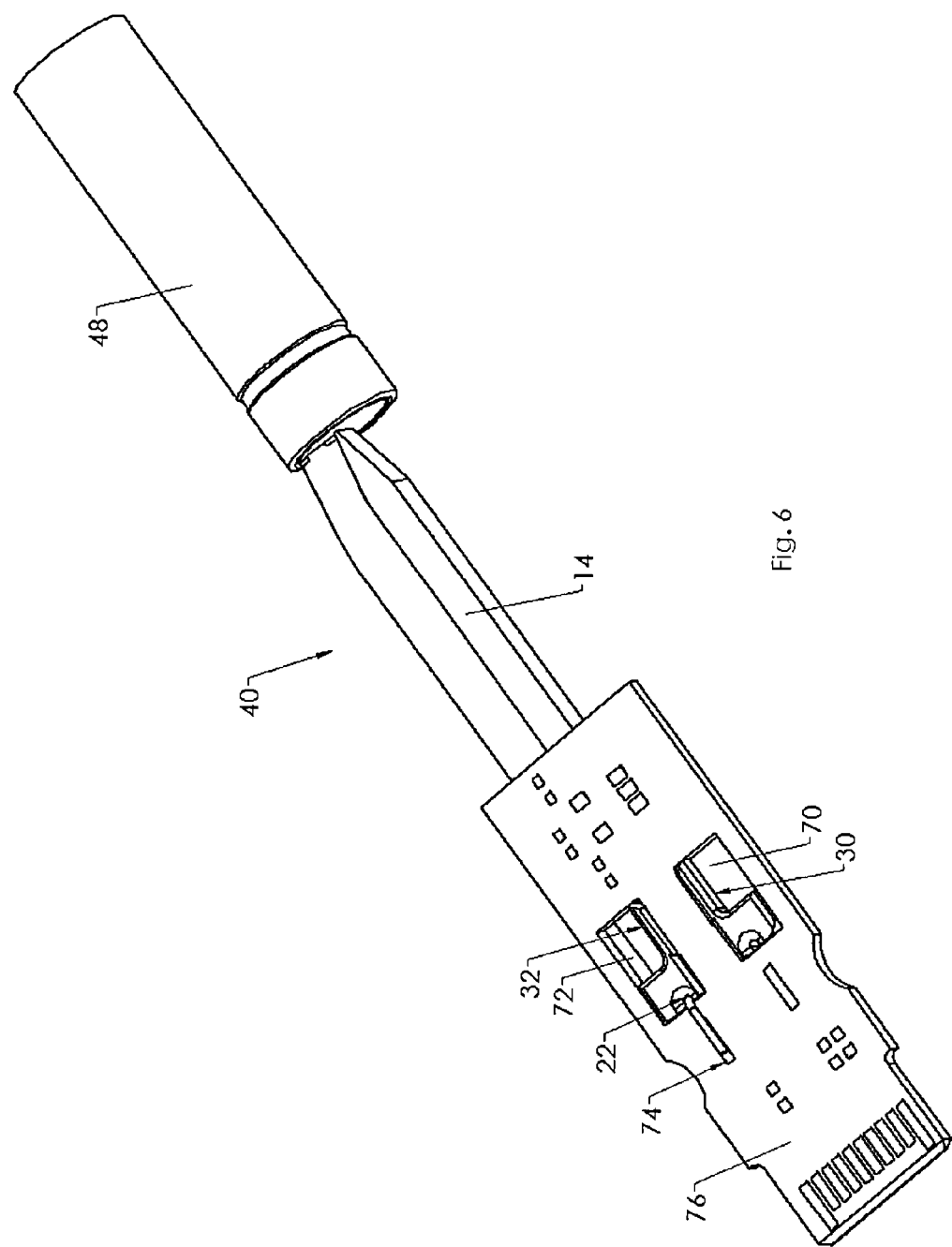
FIG. 6 is another oblique view of the combination of FIG. 5.

Referring now to FIGS. 5 and 6, the compliant members 30 and 32 of the cable guide 10 may snap into windows or openings 70 and 72 of a printed circuit board (PCB) 76. The snap-in feature (tab) facilitates location of the signal wires 42 and 44 and the ground wire 58 to contact pads or other conductors 74 on the PCB 76. By using the compliant members/features (tabs) 30 and 32, the signal wires ends 52 and 54 and the ground wire end 56 may be positioned accurately at the PCB contact pads 74. The signal wires 42 and 44 may be secured to a top surface of the PCB 76, and the ground wire 58 may pass through the slot 22 to connect to the underside of the PCB 76. The connection of the wires 42, 44, and 58 to contact pads or other conductors 74 may be made by suitable processes, such as soldering or spot welding.

In addition the snap-in feature allows the cable guide 10 to remain coupled to the PCB 76 during and after connecting the signal wires 42 and 44 and the ground wire 58 to the PCB 76. Leaving the cable guide 10 in place on the PCB 76 supports the cable 40 and its connection to the PCB 76. The cable guide 10 may protect and support the solder joints (or other connections) between the wire ends and the contact pads as the assembly is transported through the manufacturing process. With the cable guide 10 in place the joints are protected from a torsion load that could otherwise peel the contact pads 74 from the surface of the PCB 76. The cable guide remaining in place after terminating the wires to contact pads on the printed circuit board, may serve as a strain relief protecting terminations of the wires to the contact pads by restraining ends of the wires to reduce possibility of peel or torsional strain on solder joints of the wires to the contact pads and/or on adhesion of the contact pads to the printed circuit board.

Although the use of the cable guide 10 is described above in connection with connection of a cable to a printed circuit board, it will be appreciated that the cable guide 10 may be use in similar manner for termination of the cable 40 to a connector (not shown). For example the connector may have windows or openings that are engaged by the compliant members 30 and 32 of the cable guide 10.

Figure 7:
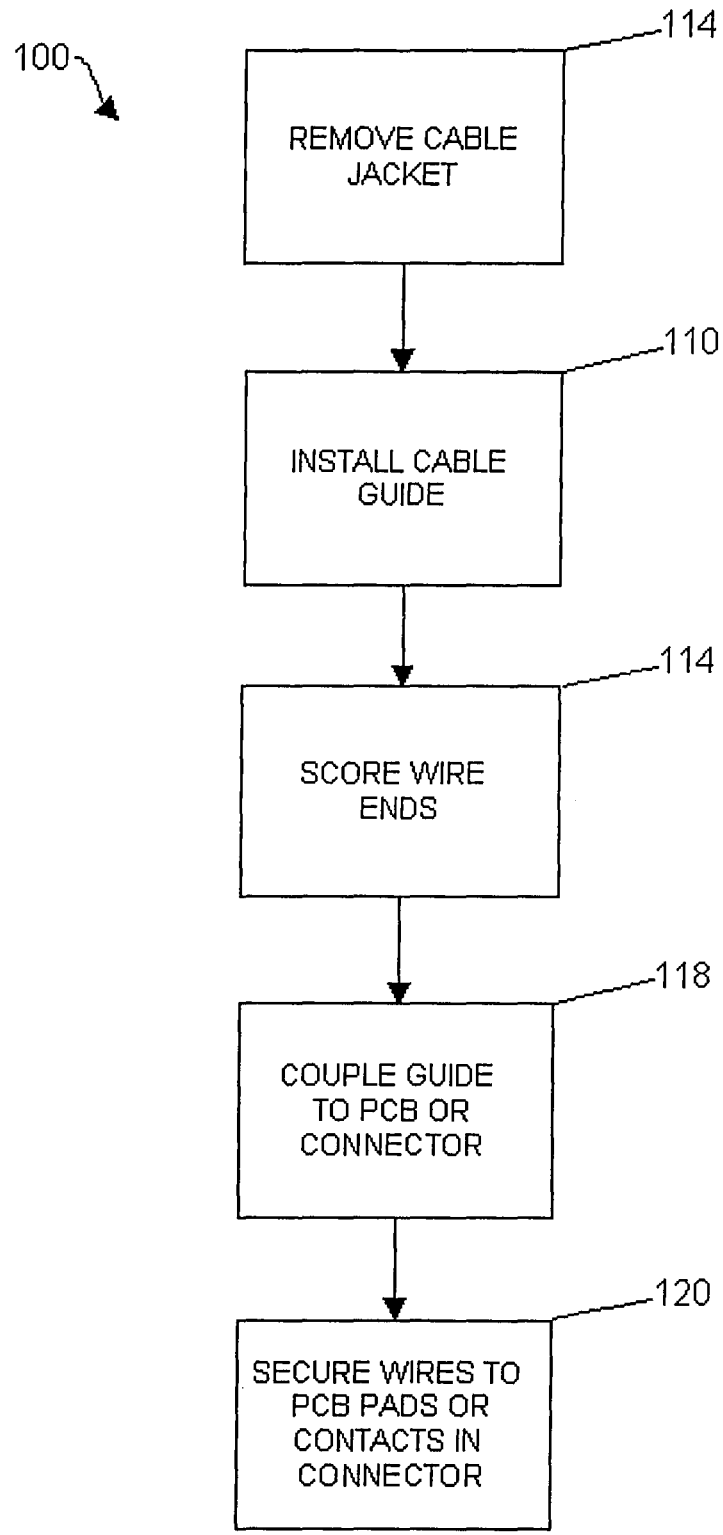
FIG. 7 is a high-level flow chart showing method steps of a method of making a cable termination, in accordance with another embodiment of the invention.

FIG. 7 shows steps in a method 100 of making a cable termination using the cable guide 10 (FIG. 1). In step 104 an end of the cable jacket 48 (FIG. 3) is removed from the cable 40 (FIG. 3), uncovering the signal and ground wires. In step 110 the cable guide 10 is installed, with insulation-clad signal wires 42 and 44 (FIG. 3) placed in the wire-receiving opening 18 (FIG. 1). Thereafter the wire ends are scored in step 114, removing the insulation and shielding covering the signal wires 42 and 44 (FIG. 4A). As discussed above, this step may be done by placing the cable guide 10 and part of the cable 40 in a suitable fixture 60 (FIG. 4B), and may accomplished using laser scoring. The end 56 of the ground wire 58 may be placed in the slot 22 (FIG. 1) of the cable guide 10. Then, in step 118, the cable guide 10 is mechanically coupled to the PCB 76 (or connector). Finally, in step 120, the wires 42, 44, and 58 may be secured to the contact pads of the PCB 76 (or connector). Thereafter other manufacturing steps may be performed, such as placing various overmolds or other parts on the PCB 76 or connector.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A cable guide in combination with a cable, the combination comprising:
   the cable guide, wherein the cable guide includes:
      a body having first and second wire-receiving openings therein; and
      a shaft extending from the body; and
   the cable, wherein the cable is a twinax cable includes:
      a first pair of wires;
      a second pair of wires; and
      a cable jacket that surrounds at least portions of the pairs of wires;
   wherein the cable guide is mechanically coupled to the cable such that the shaft is between the pairs of wires;
   wherein ends of the first pair of wires are secured in the first wire-receiving opening;
   wherein ends of the second pair of wires are secured in the second wire-receiving opening; and
   wherein the ends of the pairs of wires a predetermined distance away from where the pairs of wires separate from the cable jacket.

2. The combination of claim 1,
   wherein the cable guide has a first slot in the body that is in communication with the first wire-receiving opening;
   wherein the cable guide has a second slot in the body that is in communication with the second wire-receiving opening;
   wherein the cable also includes a first ground wire and a second ground wire;
   wherein the first ground wire is in the first slot; and
   wherein the second ground wire is in the second slot.

3. The combination of claim 2,
   wherein the first ground wire also passes through the first wire-receiving opening; and
   wherein the second ground wire also passes through the second wire-receiving opening.

4. The combination of claim 1, wherein the body has one or more compliant members that are configured to engage corresponding guide-receiving openings in a connector or printed circuit board.

5. The combination of claim 1, wherein the shaft has a narrowed end, distal from the body.

6. The combination of claim 1,
   wherein the cable guide is a one-piece continuous monolithic part; and
   wherein the cable guide is made of plastic.

7. The combination of claim 1,
   further in combination with a fixture, wherein the fixture includes a platform with a slot therein, and a cable stop;
   wherein the cable and the cable guides rests on the platform; and
   wherein ends of the wires rest against the cable stop, a predetermined distance from the slot in the platform.

8. The combination of claim 1,
   further in combination with a printed circuit board;

wherein the body has one or more compliant members that engage corresponding guide-receiving openings in the printed circuit board; and wherein the wires are connected to conductors or pads of the printed circuit board.

9. The combination of claim 8, wherein the compliant members snap into the guide-receiving openings.

10. The combination of claim 8,
wherein the wires of the pairs of wires are signal wires;
wherein the cable guide has a first slot in the body that is in communication with the first wire-receiving opening;
wherein the cable guide has a second slot in the body that is in communication with the second wire-receiving opening;
wherein the cable also includes a first ground wire and a second ground wire;
wherein the first ground wire is in the first slot;
wherein the second ground wire is in the second slot;
wherein the conductors or pads include top conductors or pads on a top surface of the printed circuit board, and bottom conductors or pads on a bottom surface of the printed circuit board;
wherein the signal wires are connected to the top conductors or pads; and
wherein the ground wires are connected to the bottom conductors or pads.

11. The combination of claim 10,
wherein the first ground wire also passes through the first wire-receiving opening; and
wherein the second ground wire also passes through the second wire-receiving opening.

12. A method of terminating a twinax cable having a first pair of wires and a second pair of wires, the method comprising:
mechanically coupling the pairs of wires to a cable guide, wherein the cable guide includes a body having a first wire-receiving opening and a second wire-receiving opening, and a shaft extending from the body, and wherein the mechanically coupling includes securing the pairs of wires in respective of the wire-receiving openings, with the shaft maintaining the ends of the wires at least a predetermined distance away from a jacket of the cable, and with the shaft between the first pair of wires and the second pair of wires;
preparing the ends of the wires for connection to a printed circuit board; and
mechanically coupling the cable to the printed circuit board.

13. The method of claim 12,
wherein the preparing occurs after the mechanically coupling the cable and the cable guide; and
wherein the preparing includes cutting the ends of the wires, after placing the cable and the cable guide a fixture.

14. The method of claim 13,
wherein the fixture includes a cable stop;
wherein the placing includes placing the ends against a stop of the fixture; and
wherein the preparing includes laser scoring the wire ends through a slot in a platform of the fixture.

15. The method of claim 12,
wherein the mechanically coupling the cable to the printed circuit board includes mechanically coupling the cable guide to the printed circuit board; and
wherein the cable guide remains in place after terminating the wires to contact pads on the printed circuit board, to serve as a strain relief protecting terminations of the wires to the contact pads by restraining ends of the wires to reduce possibility of peel or torsional strain on solder joints of the wires to the contact pads or on adhesion of the contact pads to the printed circuit board.

16. The method of claim 15, wherein the mechanically coupling the cable guide to the circuit board includes engaging one or more compliant members of the cable guide with corresponding openings of the printed circuit board.

17. The method of claim 16, wherein engaging includes positioning the ends of the wires to the contact pads of the printed circuit board in a repeatable physical relationship between the ends of the wires and the contact pads of the printed circuit board, to provide uniform impedance at the terminations.

* * * * *

UNITED STATES PATENT AND TRADEMARK OFFICE
CERTIFICATE OF CORRECTION

PATENT NO.        : 8,525,034 B2                                    Page 1 of 1
APPLICATION NO.   : 13/036064
DATED             : September 3, 2013
INVENTOR(S)       : Roath et al.

It is certified that error appears in the above-identified patent and that said Letters Patent is hereby corrected as shown below:

On the Title Page, Item [60], after "Provisional application No. 61/309,025, filed on" should read
-- Mar. 1, 2010 --.

Signed and Sealed this
Twenty-second Day of April, 2014

Michelle K. Lee
*Deputy Director of the United States Patent and Trademark Office*